United States Patent [19]

Hatada et al.

[11] Patent Number: 5,111,271
[45] Date of Patent: May 5, 1992

[54] SEMICONDUCTOR DEVICE USING STANDARD CELL SYSTEM

[75] Inventors: Hiroshi Hatada; Shojiro Mori, both of Yokohama, Japan

[73] Assignee: Kabushiki Kaisha Toshiba, Kawasaki, Japan

[21] Appl. No.: 543,128

[22] Filed: Jun. 25, 1990

[30] Foreign Application Priority Data

Jun. 26, 1989 [JP] Japan ................... 1-163197

[51] Int. Cl.⁵ .......................................... H01L 27/10
[52] U.S. Cl. ...................... 357/45; 357/41; 357/40
[58] Field of Search ................... 357/45 M, 45, 41, 40

[56] References Cited

U.S. PATENT DOCUMENTS

| 4,893,170 | 1/1990 | Tokuda et al. | 357/45 |
| 4,910,574 | 3/1990 | Aipperspach et al. | 357/41 |
| 4,951,111 | 8/1990 | Yamamoto | 357/41 |
| 4,969,029 | 11/1990 | Ando et al. | 357/41 |

FOREIGN PATENT DOCUMENTS

| 53-019775 | 2/1978 | Japan . | |
| 58-78450 | 5/1983 | Japan | 357/45 M |
| 58-87854 | 5/1983 | Japan | 357/45 M |
| 59-11670 | 1/1984 | Japan | 357/45 M |
| 62-8538 | 1/1987 | Japan | 357/45 M |
| 62-78848 | 4/1987 | Japan | 357/45 M |
| 62-177940 | 8/1987 | Japan | 357/41 |
| 1-53430 | 3/1989 | Japan . | |

OTHER PUBLICATIONS

Patent Abstracts of Japan vol. 13 No. 254 (E-722)(3602) Jun. 13, 1989.
Proceedings of the 1985 Custom Integrated Circuits Conference, May 20, 1985, pp. 12-13, S. Atiq Raza et al., "Channelless Architecture: A New Approach for CMOS Standard Cell Design".
Patent Abstracts of Japan Patent Application No. 51-94003, published Sep. 8, 1976, to Hitachi Seisakusho K.K.

Primary Examiner—Jerome Jackson, Jr.
Assistant Examiner—Hung Xuan Dang
Attorney, Agent, or Firm—Finnegan, Henderson, Farabow, Garrett, and Dunner

[57] ABSTRACT

A semiconductor device formed by using a standard cell system is a semiconductor device using a multi-layered wiring system. At this time, inter-cell wirings for electrically connecting different standard cells are formed of only a conductive layer which is disposed above a conductive layer constituting intra-cell wirings of the standard cells. Connection between the inter-cell wirings is made above an occupied area of the standard cells on the semiconductor substrate so as to eliminate a channel region.

8 Claims, 15 Drawing Sheets

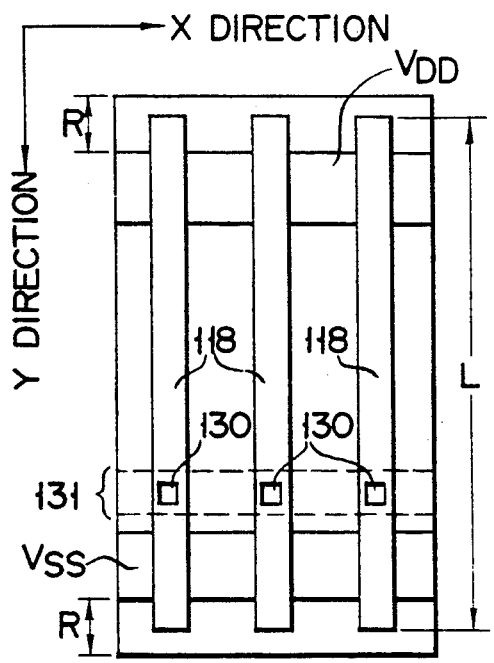
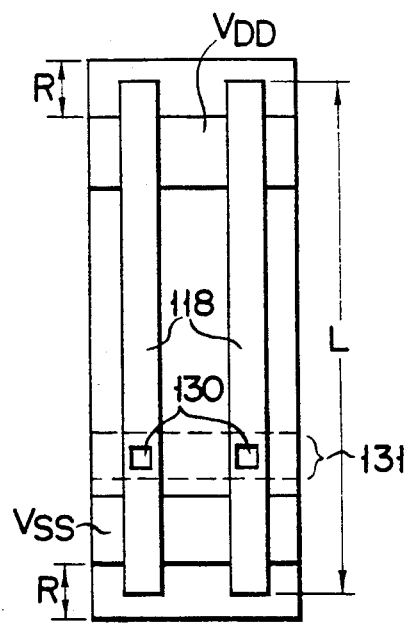
FIG. 3A  FIG. 3B
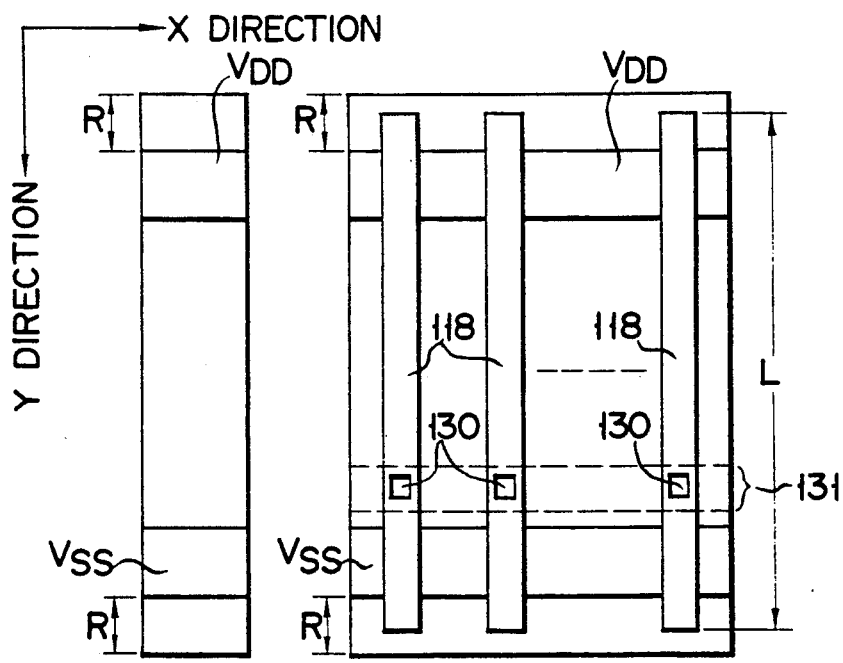
FIG. 3C  FIG. 3D

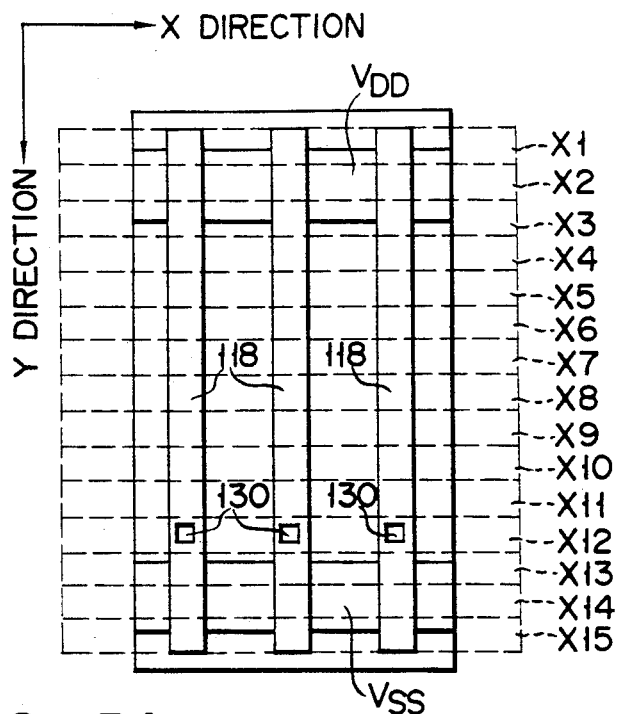
F I G. 5A
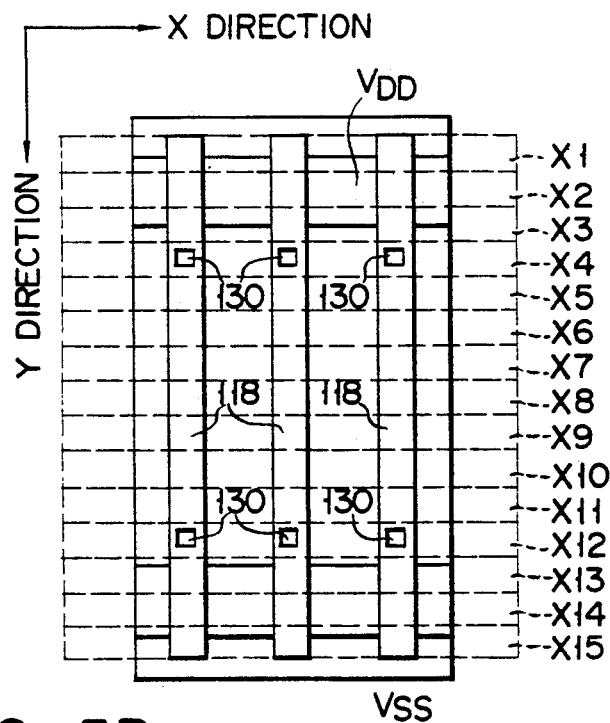
F I G. 5B

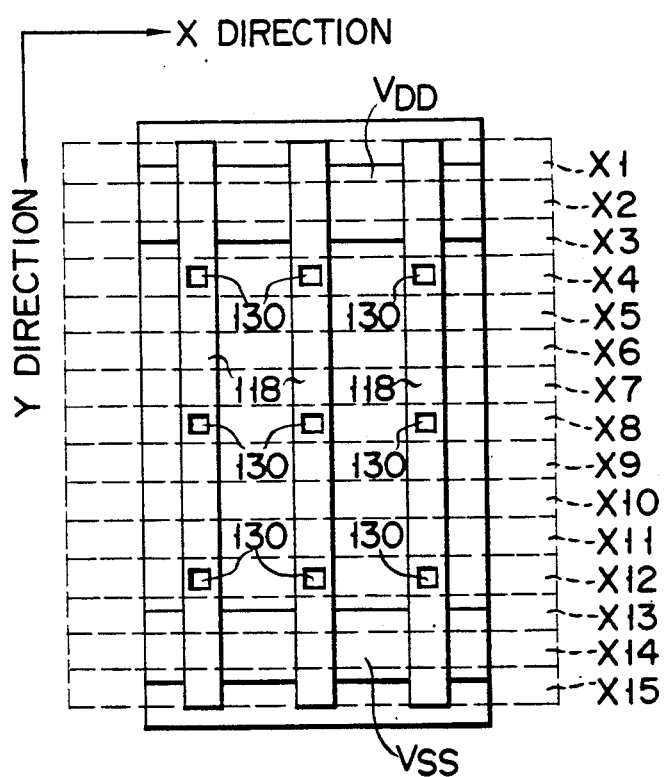
F I G. 5C

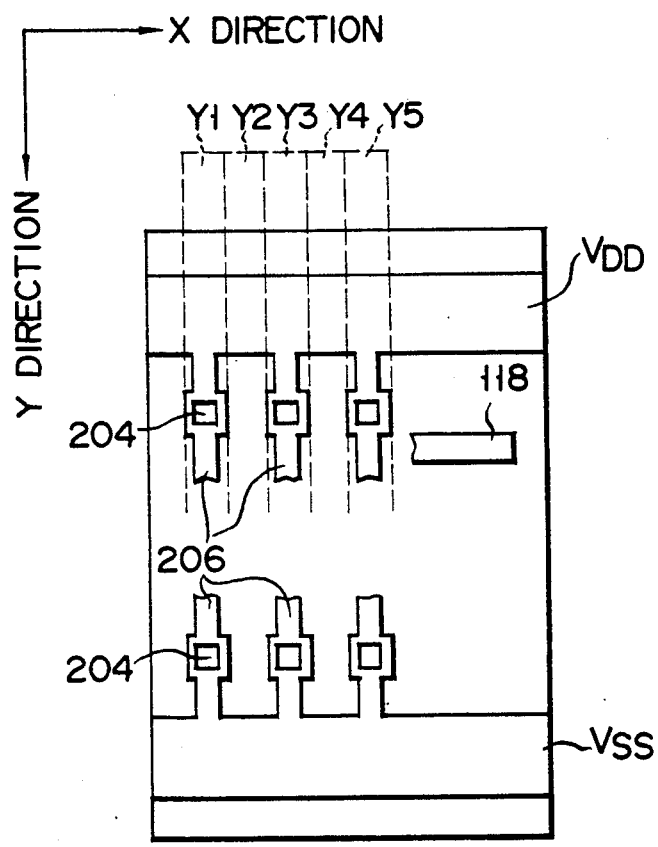
F I G. 15

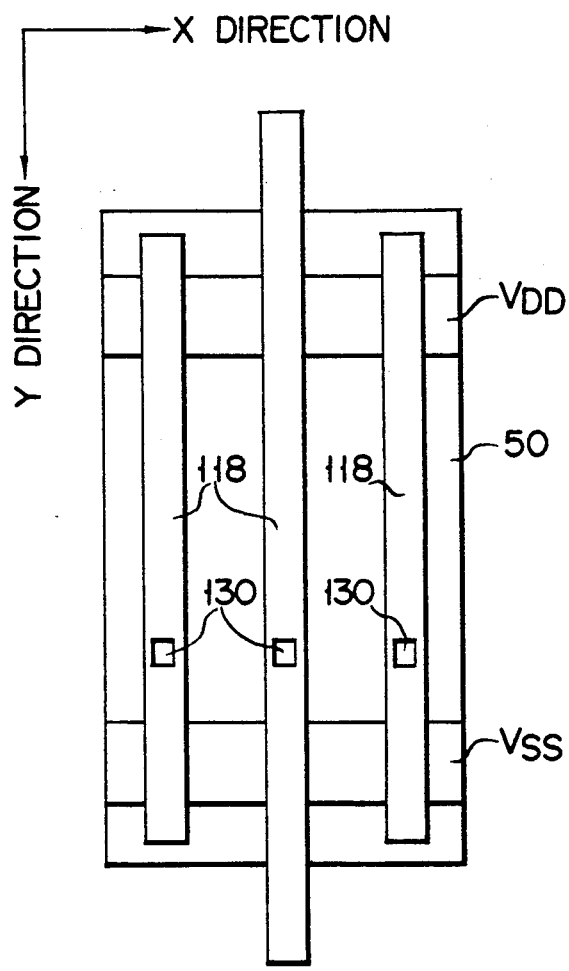
F I G. 16

SEMICONDUCTOR DEVICE USING STANDARD CELL SYSTEM

BACKGROUND OF THE INVENTION

1. Field of the Invention

This invention relates to a semiconductor device using a standard cell system, and more particularly to a semiconductor device having improved inter-cell wiring for connecting standard cells to one another.

2. Description of the Related Art

A standard cell type semiconductor device is known as one type of semiconductor device (ASIC) for a special application. The standard cell is a standard logic circuit such as an AND, NAND, OR or NOR. In the standard cell system, the standard cells are registered in a library, and various circuits can be designed by variously combining the standard cells in the most suitable cell arrangement pattern and in the most suitable inter-cell wiring pattern. For this reason, the standard cell system is mainly used for semiconductor devices which will be manufactured each time small orders have been received.

The wirings inside the standard cell or between the standard cells are formed of a conductive layer having three layers sequentially laminated on the main surface of a semiconductor substrate.

More specifically, a polysilicon layer, first and second aluminum layers are sequentially formed from the main surface of the semiconductor substrate. The polysilicon layer is used for the gate electrodes of transistors or the like, the first aluminum layer is used for forming wirings connecting the gate electrodes of the transistors to one another and intra-cell wirings such as power source lines or the like arranged in a row direction of the standard cell, and a second aluminum layer is used for wirings for connection between the cells or inter-cell wirings arranged in a direction perpendicular to the power source lines.

In the standard cell system, the inter-cell wiring pattern or the pattern of the wirings in the cell formed of the first aluminum layer is standardized and registered. In the registered standard cell, two power source lines of high and low potentials which are necessary for circuit operation are of the first aluminum layer and are separately arranged in parallel with each other at the end portion of the standard cell area. Further, since the arranged positions of the two power source lines are set on the end portion of the standard cell, the power source lines can be arranged in the same position in all of the registered standard cells.

In the semiconductor device using the standard cell system, a plurality of standard cells as described above are arranged in a direction along the power source lines. The thus arranged standard cells are called a standard cell array. Further, in the present device, a plurality of standard cell arrays are on the semiconductor substrate.

The wirings of the second aluminum layer are connected to the intra-cell wirings of the first aluminum layer, and as described above, arranged in a direction perpendicular to the power source lines to constitute part of the inter-cell wirings. The inter-cell wirings of the second aluminum layer to extend over the power source lines to an area other than the standard cell area, particularly, between the standard cell array. The inter-cell wirings for connection between the standard cells or between the inter-cell wirings formed of the second aluminum layer are of the first aluminum layer, and arranged in a direction perpendicular to the inter-cell wirings formed of the second aluminum layer between the standard cell arrays. The inter-cell wirings of the first aluminum layer and the inter-cell wirings formed of the second aluminum layer are connected to each other between the standard cell arrays so as to attain a desired circuit output.

An area between the standard cell arrays is determined as a wiring area for electrically connecting the standard cells to one another to attain a desired circuit output and is generally called a channel region.

However, in the conventional device in which the channel region is provided between the standard cell arrays, the area of the channel region on the semiconductor substrate is further increased with an increase in the number of inter-cell wirings necessary for attaining more complicated logic functions.

As a result, the integration density of the semiconductor device formed by using the standard cell system cannot be easily enhanced.

SUMMARY OF THE INVENTION

An object of this invention is to provide a semiconductor device which can be formed by using the standard cell system with a higher integration density.

The above object can be attained by a semiconductor device formed by using a standard cell system, comprising a semiconductor substrate having a main surface; a plurality of standard cells formed on the main surface; intra-cell wirings formed inside the standard cells; and inter-cell wirings formed of only a conductive layer formed above a conductive layer constituting the intra-cell wirings, for electrically connecting the plurality of standard cells to one another.

With the above construction, the inter-cell wirings for electrically connecting different standard cells to each other is formed of only a conductive layer which lies above a conductive layer which constitutes the intra-cell wirings formed inside the standard cell. As a result, a channel region for electrically connecting the standard cells lying between the standard cell arrays can be omitted.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 3A to 3D are plan views showing first examples of registered patterns of standard cells;

FIGS. 5A to 5C are plan views showing examples of preferable registered patterns of standard cells;

FIG. 15 is a plan view of a standard cell showing part of the schematic plane pattern of intra-cell wirings;

FIG. 16 is a plan view showing a fifth example of a registered pattern of a standard cell.

DETAILED DESCRIPTION OF THE PREFERRED EMBODIMENTS

There will now be described a semiconductor device formed by using a standard cell system according to this invention.

EMBODIMENT 1

Figure 1:
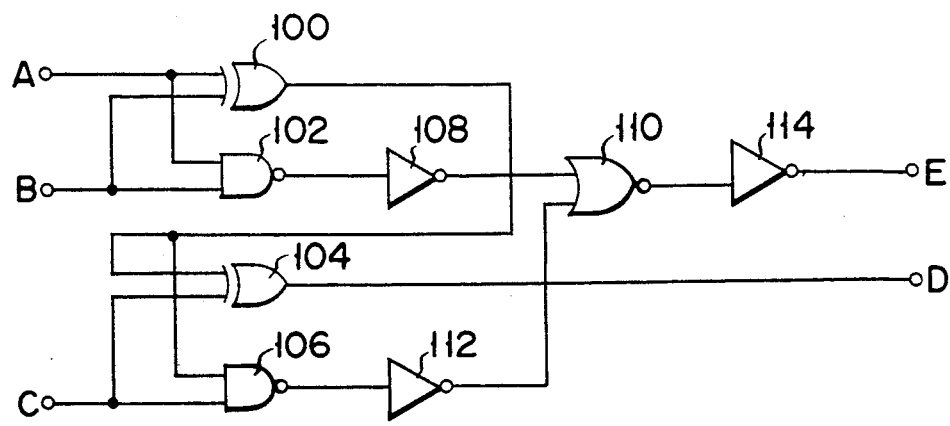
FIG. 1 is a circuit diagram of a full adder.
Figure 2:
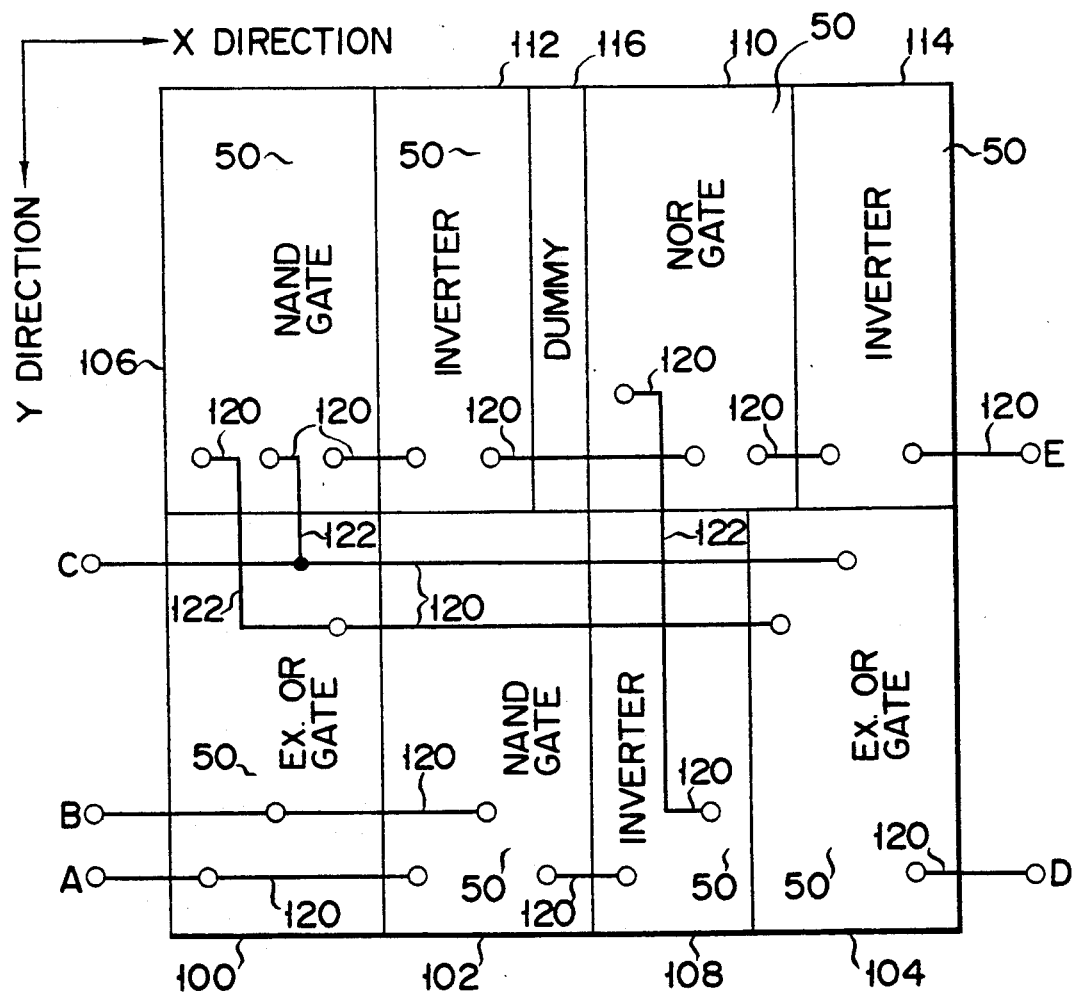
FIG. 2 is a block diagram schematically showing a full adder by using a standard cell system according to a preferred embodiment of the present invention.

FIG. 1 is a circuit diagram of a full adder, and FIG. 2 is a schematic block diagram showing the full adder which is by using the standard cell system according to this invention. In FIGS. 1 and 2, the same portions are denoted by the same reference numerals.

As shown in FIGS. 1 and 2, a first input A is supplied to a first exclusive-OR gate 100 and a first NAND gate 102. Likewise, a second input B is supplied to the first exclusive-OR gate 100 and the first NAND gate 102. An output of the first exclusive-OR gate 100 is supplied to a second exclusive-OR gate 104 and a second NAND gate 106. A third input C is supplied to the second exclusive-OR gate 104 and the second NAND gate 106. An output of the first NAND gate 102 is supplied to a first inverter 108. An output of the first inverter 108 is input to a NOR gate 110. An output of the second exclusive-OR gate 104 is supplied to a first output D. An output of the second NAND gate 106 is input to a second inverter 112. An output of the second inverter 112 is input to the NOR gate 110. An output of the NOR gate 110 is input to a third inverter 114 and an output of the third inverter 114 is supplied to a second output E.

In the block diagram of FIG. 2, each block indicates an occupied area 50 of a standard cell on the semiconductor substrate. In FIG. 2, 116 denotes a dummy cell. Intra wiring S are formed of first aluminum layer. Second aluminum is used for cell terminal wirings. In this embodiment, inter-cell wirings for electrically connecting standard cells to one another include inter-cell wirings 120 implemented by a third aluminum layer to extend in an X direction and inter-cell wirings 122 formed of a fourth aluminum layer to extend in a Y direction. The inter-cell wirings 120 and 122 are connected to each other above the occupied areas 50 of the standard cells on the semiconductor substrate. As a result, unlike the prior art case, it is not necessary to provide a channel region used for connecting the standard cells to one another between the standard cell arrays.

FIGS. 3A to 3D are plan views showing first examples of basic patterns registered into a library of standard cells in a preferred embodiment of the present invention. In FIGS. 3A to 3D, a polysilicon layer used for gate electrodes of transistors above the main surface of the semiconductor substrate is omitted only for simplifying the drawing. Further, the first aluminum layer except the high-potential power source line VDD and low-potential power source line VSS which is above the polysilicon layer and used for the intra-cell wirings is also omitted for the same reason.

FIG. 3A is a plan view of a registered pattern of an exclusive-OR gate, NOR gate or NAND gate shown in FIG. 2.

As shown in FIG. 3A, the high-potential power source line VDD and low-potential power source line VSS are constructed by the first aluminum layer and extend in the X direction. Cell terminal wirings 118 which are arranged above the power source lines VDD and VSS, constructed by the second aluminum layer formed above the first aluminum layer to extend in the Y direction are above the high-potential power source line VDD and low-potential power source line VSS. The cell terminal wirings 118 are in contact with intra-cell wirings for connecting the gate electrodes of transistors (not shown), for example, which are implemented by the first aluminum layer to one another via via-holes 130. The cell terminal wirings 118 are previously registered into the library with their length L set to a preset value. The cell terminal wirings 118 function as input and output terminals of the standard cell.

The cell terminal wirings 118 are in contact with the inter-cell wirings 120 (not shown in FIG. 3A) and are constructed by the third aluminum layer above the second aluminum layer. The inter-cell wirings 120 are in contact with the inter-cell wirings 122 (not shown in FIG. 3A) and are constructed by a fourth aluminum layer formed above the third aluminum layer. The standard cells are electrically connected to one another by mean of the inter-cell wirings 120 and 122 which are respectively constructed by the different aluminum layers extending in the X and Y directions.

Further, if the cell terminal wirings 118 having the preset length L are previously registered to have the preset length L, an area in which the cell terminal wirings 118 are connected to the inter-cell wirings 120 extending in the X direction can be provided over the length L.

The standard cells are registered with a distance R set between the ends of the power source lines VDD and VSS and the end of the standard cell area.

In the device according to a preferred embodiment of the present invention, no channel region is provided between the standard cell arrays. For this reason, if the ends of the power source lines VDD and VSS and the end of the standard cell area are registered to be set in the same position in the same manner as in the conventional case, then the power source lines of the different standard cell arrays are short-circuited. In order to prevent occurrence of the short circuit, the ends of the power source lines VDD and VSS and the end of the standard cell area are deviated from each other by the distance R, and the standard cells are registered into the library with the distance R caused by the deviation between them.

In this case, it is preferable to set the same distance R for all of the standard cells to be registered into the library.

FIG. 3B is a registered pattern of, for example, the inverter shown in FIG. 2. Portions of FIG. 3B which are the same as those of FIG. 3A are denoted by the same reference numerals.

As shown in FIG. 3B, also in the registered pattern of the inverter, cell terminal wirings 118 are provided which have a preset length L and are implemented by the second aluminum layer and arranged to extend over the power source lines VDD and VSS.

FIG. 3C shows a registered pattern of dummy cells.

As shown in FIG. 3C, in the registered pattern of the dummy cells, it is not always necessary to provide cell terminal wirings, and at least the power source lines VDD and VSS are provided.

FIG. 3D shows a registered pattern of a standard cell which requires three or more terminals.

As shown in FIG. 3D, in a case where the standard cell is required to have three or more terminals, for example, in the case of a 3-input/1-output NAND gate, three or more cell terminal wirings 118 having a preset length L and implemented by the second aluminum layer are provided.

Thus, the number of cell terminal wirings 118 may be variously modified and registered according to the function of the standard cell.

Further, as described above, the cell terminal wirings 118 are in contact with the intra-cell wirings which are of the first aluminum layer and positioned below the second aluminum layer which implements the cell terminal wirings via the via-holes 130. In this way, an electric signal can be generated out from elements inside the standard cell or an electric signal can be applied to the elements.

In the standard cell system, an area disposed above an area in which the contact for the wirings are made is regarded as being a wiring inhibition area, and no wirings are formed above the area.

In the device according to a preferred embodiment of the present invention, an opening area 131 for via-holes 130 linearly extending along the power source line VDD or VSS is previously provided, for example.

With this construction, a large number of wiring areas in which the inter-cell wirings can freely pass over the occupied area of the standard cell can be provided above the occupied area.

The wiring inhibition area is explained in more detail with reference to FIG. 4A.

Figure 4A:
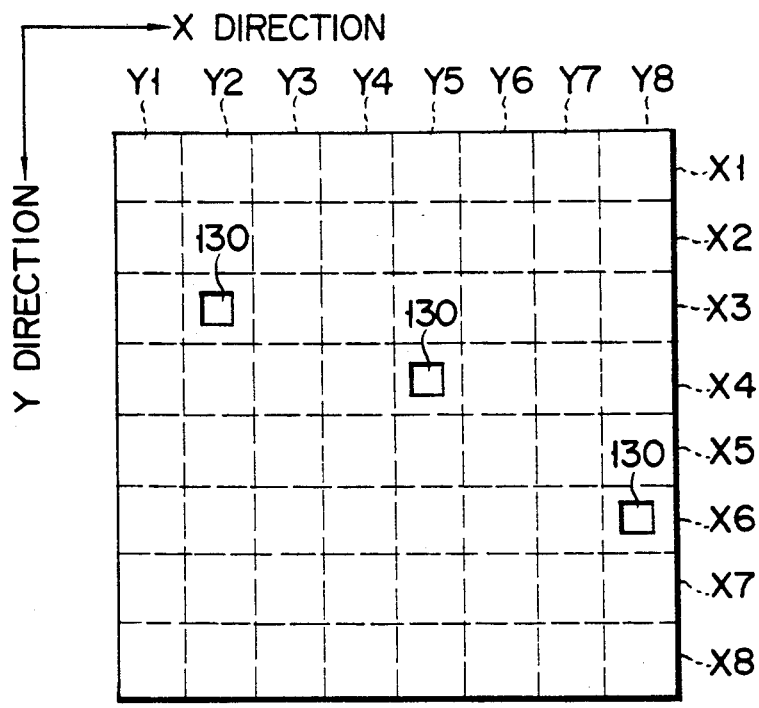
FIGS. 4A to 4B are diagrams for illustrating the wiring inhibition state.

Assume that, as shown in FIG. 4A, a computer for controlling the standard cell system recognizes eight wiring areas X1 to X8 in the X direction and eight wiring areas Y1 to Y8 in the Y direction, for example.

Further, assume that the intra-cell wirings and the power source lines VDD and VSS in the X direction are implemented by the first aluminum layer. The arrangement direction of the cell terminal wirings of the second aluminum layer is set in the Y direction so that the cell terminal wirings may be arranged to extend over the power source lines VDD and VSS. Then, the via-holes 130 for making the cell terminal wirings in contact with the intra-cell wirings are formed in positions (X3, Y2), (X4, Y5) and (X6, Y8).

At this time, the positions (X3, Y2), (X4, Y5) and (X6, Y8) are determined as the wiring inhibition areas and no inter-cell wirings are formed to pass over the areas.

Therefore, five out of the eight wiring areas X1 to X8 except the wiring areas X3, X4 and X6 can be used as the wiring areas which can freely pass over the occupied area of the standard cell.

Figure 4B:
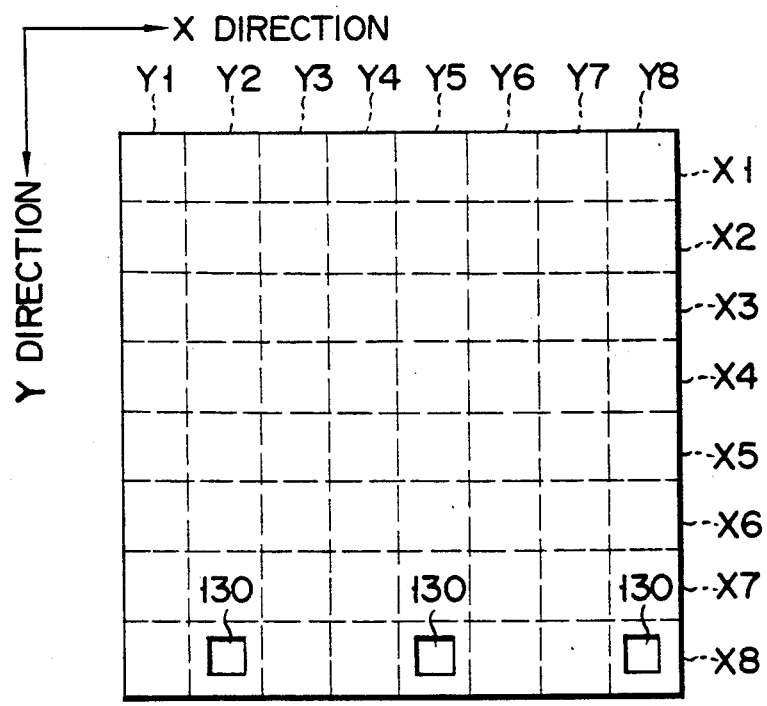

In this case, in the device of this invention, in order to ensure a larger number of wiring areas which can freely pass over the occupied area of the standard cell, via-holes 130 as is shown in FIG. 4B are formed.

That is, as shown in FIG. 4B, the via-holes 130 are formed in the positions (X8, Y2), (X8, Y5) and (X8, Y8). In this way, the via-holes 130 are concentrated on one of the eight wiring areas, for example, the wiring area X8.

With this arrangement, only the wiring area X8 among the wiring areas in the X direction includes the wiring inhibition area. As a result, even if the same number of via-holes as in the case of FIG. 4A are present, seven out of the eight wiring areas X1 to X8, all the wiring areas but the wiring area X8, can freely pass over the standard cell area in the case of FIG. 4B.

In this way, in the standard cell of FIG. 4B, a larger number of wiring areas which can freely pass over the standard cell area can be ensured.

FIGS. 5A to 5C are plan views showing preferable examples of registered patterns of standard cells to which the above method is applied. Portions of FIGS. 5A to 5C which are the same as those of FIGS. 1 to 3 are denoted by the same reference numerals.

The standard cell shown in FIG. 5A is a standard cell having 15 wiring areas X1 to X15 arranged in the X direction, for example. In such a standard cell, via holes 130 for connecting the cell terminal wirings 118 with intra-cell wirings are concentrated on one wiring area X12. Therefore, 14 out of the 15 wiring areas X1 to X15, that is, all the wiring areas but the wiring area X12 can freely pass over the standard cell area.

The standard cell shown in FIG. 5B is a standard cell having the same number of wiring areas as in the case of FIG. 5A. In such a standard cell, if it is required to contact the cell terminal wirings 118 with intra-cell wirings in two positions. Via-holes 130 are concentrated on two wiring areas X4 and X12, for example. Therefore, the number of wiring areas which can freely pass over the standard cell area can be set to maximum.

The standard cell shown in FIG. 5C is a standard cell having the same number of wiring areas as in the case of FIG. 5A. In such a standard cell, if it is required to contact the cell terminal wirings 118 in intra-cell wirings (not shown) in three positions. The number (three) of contacts which is required by one cell terminal wiring 118 is set equal to that of the wiring areas including the wiring inhibition area caused by the contacts by using the same method as is explained in FIG. 5B. As a result, twelve out of the fifteen wiring areas X1 to X15, that is, all the wiring areas but the wiring areas X4, X8 and X12 can be used as wiring areas which can freely pass over the standard cell area.

Thus, it is preferable to set the opening area 131 shown in FIGS. 3A, 3B and 3D so as to correspond to the wiring area shown in FIGS. 5A to 5C.

The inter-cell wirings 120 and 122 are located above portions of the cell terminal wirings 118, other than portions of the cell terminal wirings in which said via holes 130 are formed.

Figure 6:
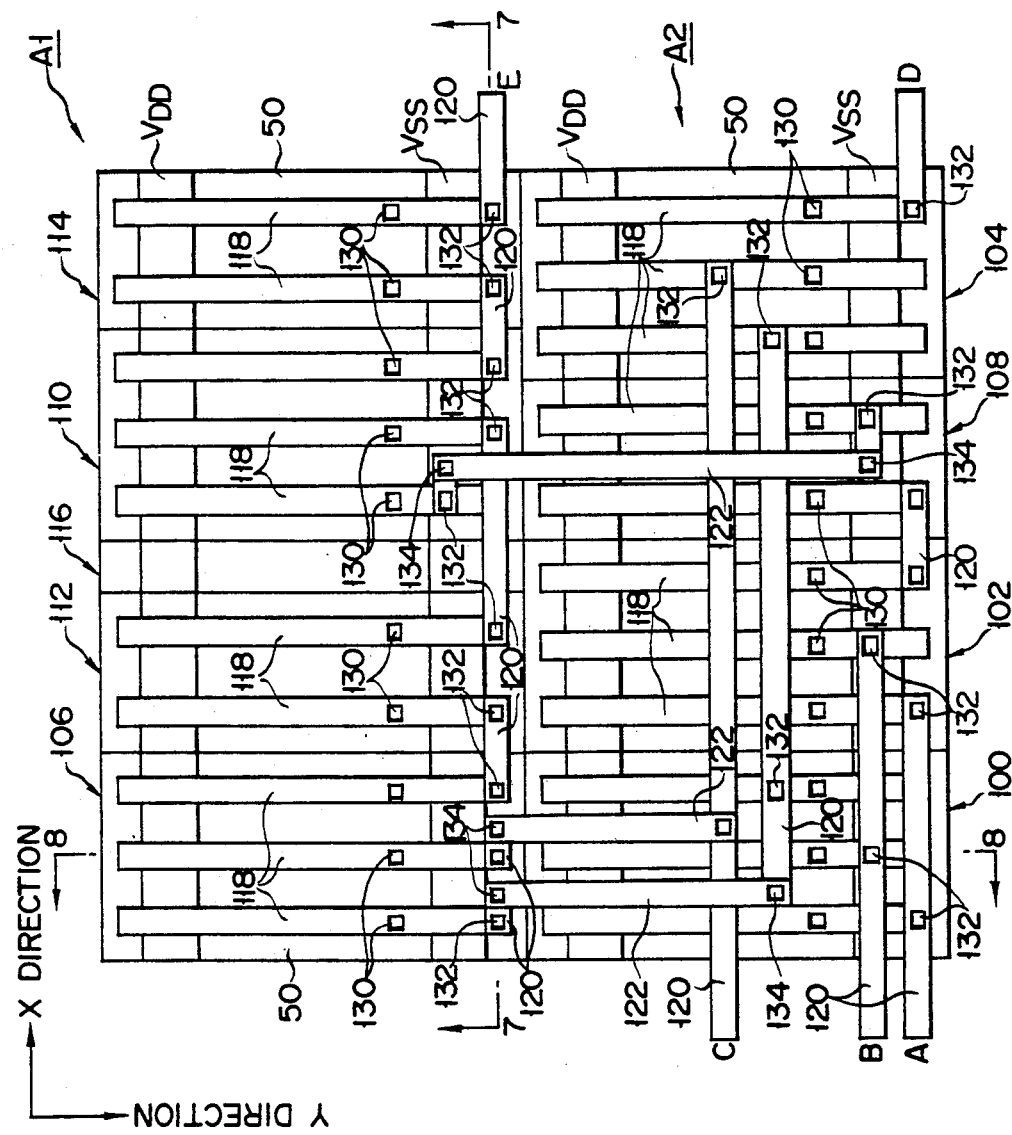
FIG. 6 is a plan view of a semiconductor device having a full adder circuit formed on a semiconductor substrate by using the standard cells shown in FIGS. 3A to 3D.
Figure 7:
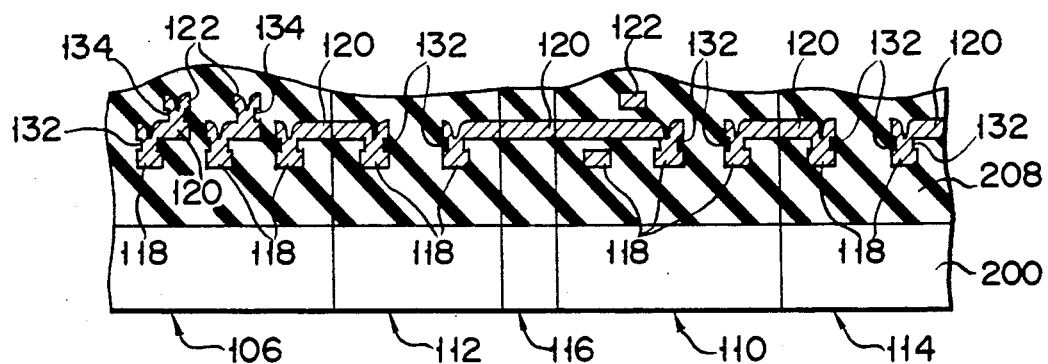
FIG. 7 is a cross sectional view taken along the line 7—7 of FIG. 6.
Figure 8:
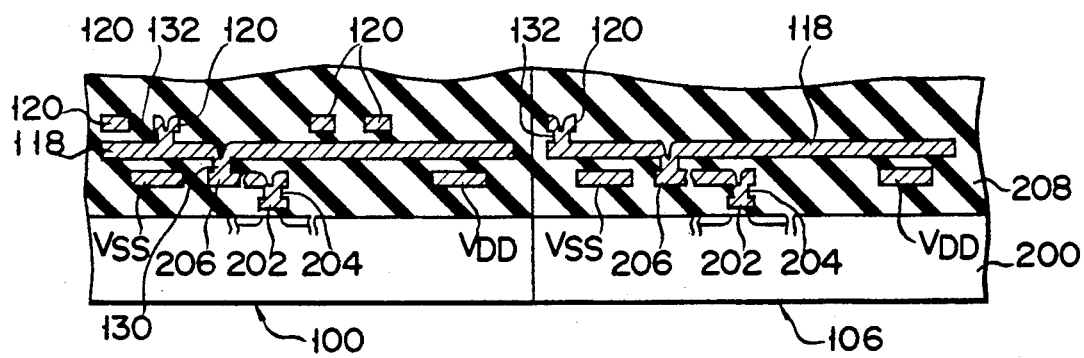
FIG. 8 is a cross sectional view taken along the line 8—8 of FIG. 6

FIG. 6 is a plan view of a semiconductor device having the full adder circuit of FIG. 1 on a semiconductor substrate using the standard cells shown in FIGS. 3A to 3D. A cross section taken along the line 7—7 of FIG. 6 is shown in FIG. 7, and a cross section taken along the line 8—8 of FIG. 6 is shown in FIG. 8. Portions of FIGS. 6 to 8 which are the same as those shown in FIGS. 1 to 3 are denoted by the same reference numerals.

As shown in FIGS. 6 to 8, polysilicon layers 202 are on the main surface of a silicon substrate 200, for example, to implement the gate electrodes of MOSFETs which are circuit elements. Intra-cell wirings 206 shown in FIG. 8 and constituted by a first aluminum layer are in contact with the polysilicon layer 202 via contact holes. The first aluminum layer also constitutes power source lines VDD and VSS in addition to the intra-cell wirings 206. Cell terminal wirings 118 constituted by a second aluminum layer are in contact with the cell terminal wirings 206 via via-holes 130. The cell terminal wirings 118 are implemented by contact with inter-cell wirings 120 which are a third aluminum layer and extend in the X direction. The inter-cell wirings 120 are in contact with inter-cell wirings 122 which are implemented by a fourth aluminum layer and extend in the Y direction. The wirings of the above conductive layers, the polysilicon layer and the first to fourth aluminum layers, are insulated from one another by interlayer insulation film 208 shown in FIGS. 7 and 8.

In the drawing, A1 denotes a standard cell array constituted by a NAND gate 106, inverter 112, dummy 116, NOR gate 110 and inverter 114. Likewise, A2 denotes a standard cell array constituted by an exclusive-OR gate 100, NAND gate 102, inverter 108 and exclusive-OR gate 104.

In the above semiconductor device, the inter-cell wirings 120 and 122 for electrically connecting the standard cells to one another are implemented by the third and fourth aluminum layers, respectively. Therefore, the electrical connection between the standard cells can be made above the occupied area 50 of the standard cells and a channel region which has been conventional provided between the standard cell arrays A1 and A2 for electrically connecting the standard cells to one another can be eliminated.

Therefore, according to this invention, the integration density of the semiconductor device using the standard cell system can be further enhanced.

Further, in this invention, the cell terminal wirings 118 implemented by the second aluminum layer and having a preset length L are provided for each standard cell and registered into the library. In addition, the inter-cell wirings 120 implemented by the third aluminum layer are arranged in a direction perpendicular to the arrangement direction of the cell terminal wirings 118. With this arrangement, an area in which the cell terminal wirings 118 and the inter-cell wirings 120 can be connected to each other can be ensured over the length L of the cell terminal wirings 118. However, since an area lying above the via-holes 130 for making contact between the cell terminal wirings 118 and the intra-cell wirings 206 is determined as the wiring inhibition area, the area is excluded from the area for permitting connection between the cell terminal wirings 118 and the inter-cell wirings 120.

In the preferred embodiment, the way of excluding the area is also taken into consideration. That is, in order to minimize reduction in the number of wiring areas which can freely pass over the standard cell area due to the presence of the wiring inhibition area, the via-holes 130 are concentrated on one wiring area. With this arrangement, a larger number of wiring areas which can freely pass over the standard cell area can be ensured above the cell terminal wirings 118.

Thus, the degree of freedom of the design relating to the arrangement and connection of the inter-cell wirings 120 and 122 can be enhanced.

EMBODIMENT 2

Figure 9:
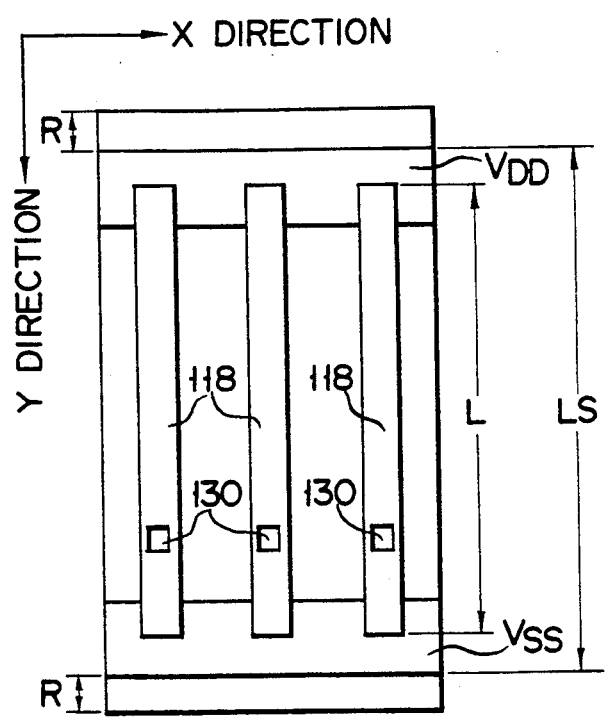
FIG. 9 is a plan view showing a second example of a registered pattern of a standard cell.
Figure 10:
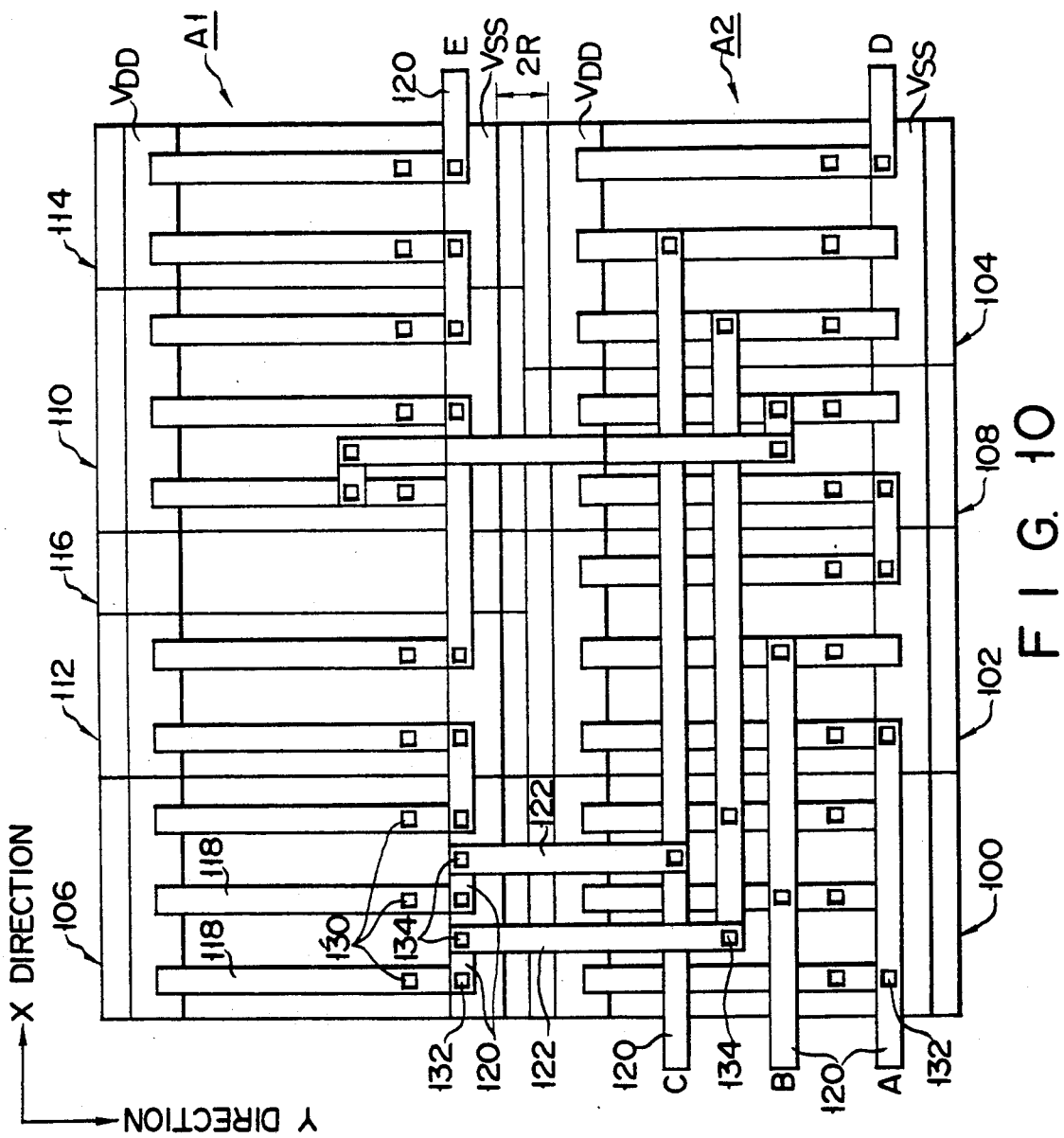
FIG. 10 is a plan view of a semiconductor device having a full adder circuit on a semiconductor substrate by using the standard cells shown in FIG. 9.

FIG. 9 is a plan view showing a second example of a basic registered pattern of the standard cell of this invention in the library, and FIG. 10 is a pan view of a semiconductor device having the full adder circuit of FIG. 1 using the standard cells shown in FIG. 9.

In FIGS. 9 and 10, the same portions as those in FIGS. 3A and 6 are denoted by the same reference numerals, and only different portions are explained.

In the standard cell of FIG. 9, the length L of the cell terminal wirings 118 is set to be smaller than the length LS between the power source lines VDD and VSS, and the cell terminal wirings 118 are arranged between the power source lines VDD and VSS.

In the semiconductor device thus formed by using the above standard cells, no cell terminal wirings 118 are formed in an area of distance R. For example, when the distance R is set to ½ of the minimum design rule and a plurality of standard cell arrays are formed, a distance between the two power source lines of the different standard cells will be 2R.

That is, as shown in FIG. 10, the distance 2R between the power source line VSS of the standard cell A1 and the power source line VDD of the different standard cell A2 is determined as the minimum design rule. As a result, the distance between the wirings arranged on the end most portion of the standard cell array becomes minimum. Therefore, the integration density of the semiconductor device using the standard cell system can be further enhanced.

EMBODIMENT 3

Figure 11:
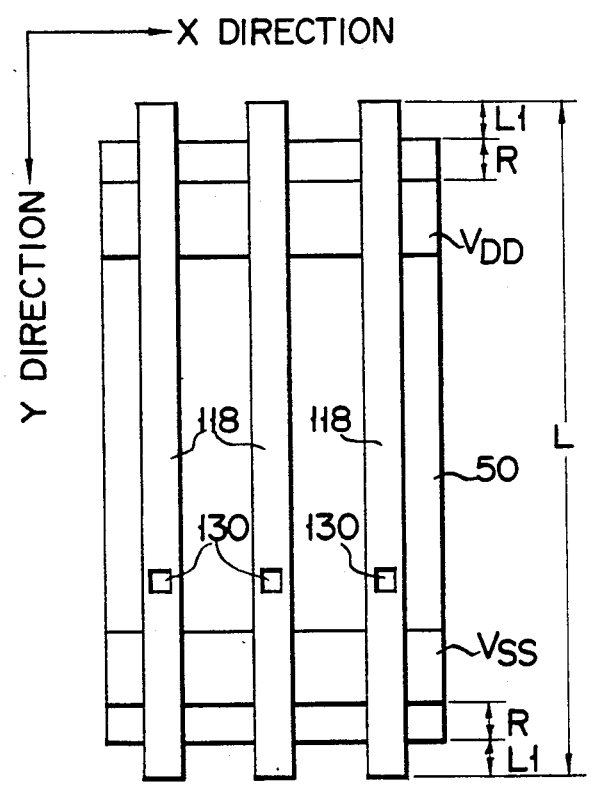
FIG. 11 is a plan view showing a third example of a registered pattern of a standard cell.
Figure 12:
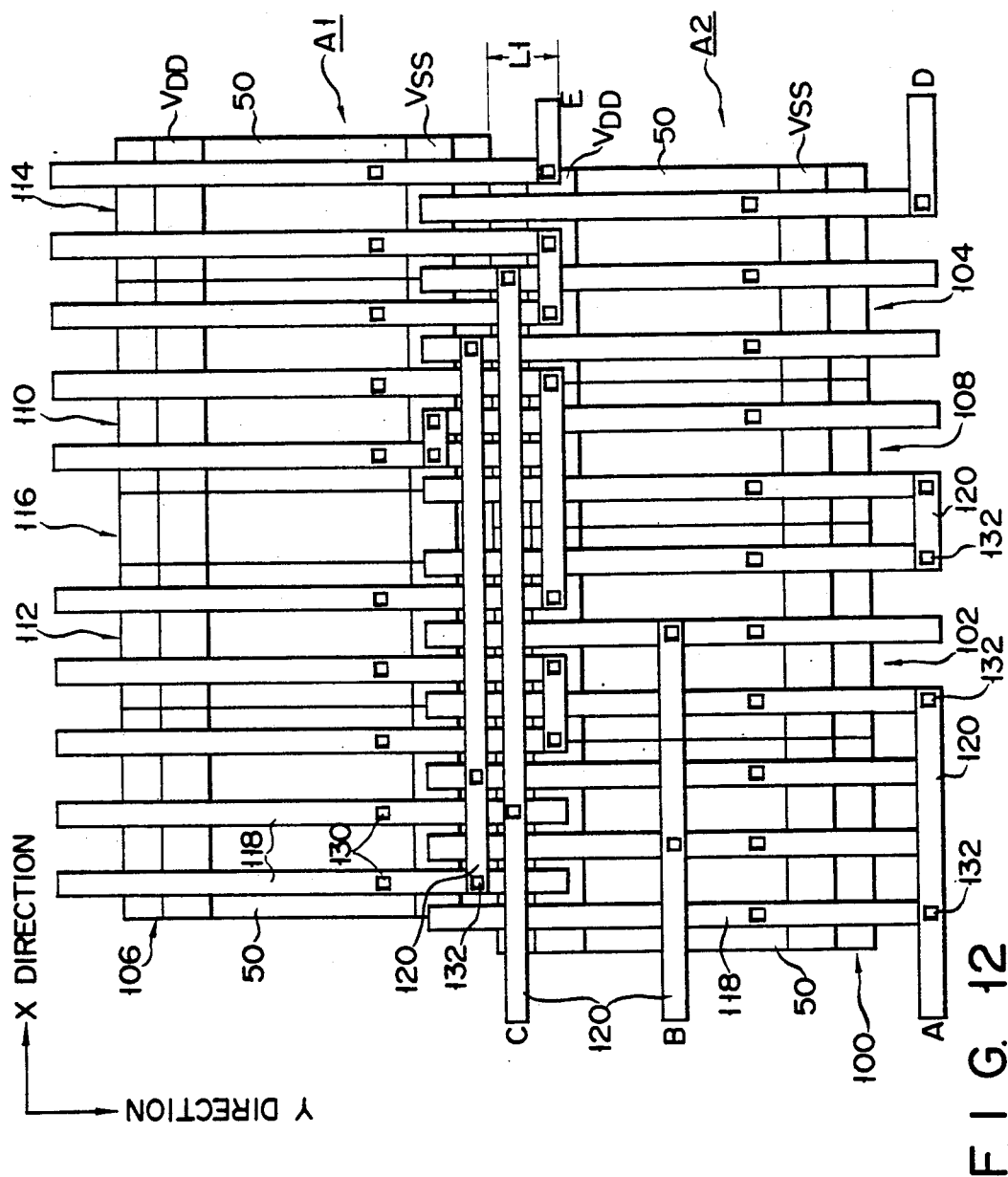
FIG. 12 is a plan view of a semiconductor device having a full adder circuit on a semiconductor substrate by using the standard cells shown in FIG. 11.

FIG. 11 is a plan view showing a third example of a basic registered pattern of the standard cell of this invention in the library, and FIG. 12 is a plan view of a semiconductor device having the full adder circuit of FIG. 1 using the standard cells shown in FIG. 11.

In FIGS. 11 and 12, the same portions as those in FIGS. 3A and 6 are denoted by the same reference numerals, and only different portions are explained.

In the standard cell of FIG. 11, the cell terminal wirings 118 are longer than the occupied area 50 of the standard cell. That is, the cell terminal wirings 118 are formed to extend over the power source lines VDD and VSS and the end portions thereof project from the occupied area 50 of the standard cell by a length L1.

With a semiconductor device formed by using the above standard cell, the projecting portions L1 of the cell terminal wirings 118 extend into the occupied area 50 of the other standard cell. In this case, as shown in FIG. 12, the two standard cell arrays A1 and A2 are deviated from each other so as to prevent the cell terminal wirings 118 of different standard cells from being made in contact with each other.

With this arrangement, those portions of the cell terminal wirings 118 which extend over the occupied area 50 of the different standard cell, that is, the projecting portions L1 may also serve as the inter-cell wirings formed to extend in the Y direction in the same manner as the inter-cell wirings 122 formed of the fourth aluminum layer in the above embodiment.

As a result, a semiconductor device in which no channel region is provided can be implemented by using only the first, second and third aluminum layers according to the standard cell system as in the first and second embodiments.

EMBODIMENT 4

Figure 13:
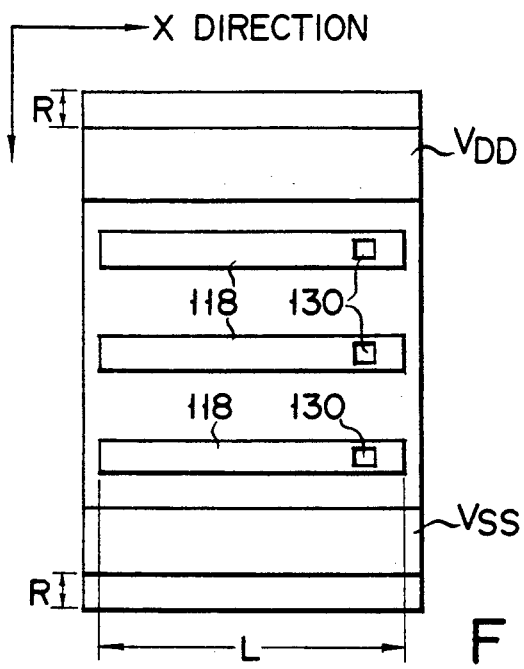
FIG. 13 is a plan view showing a fourth example of a registered pattern of a standard cell.
Figure 14:
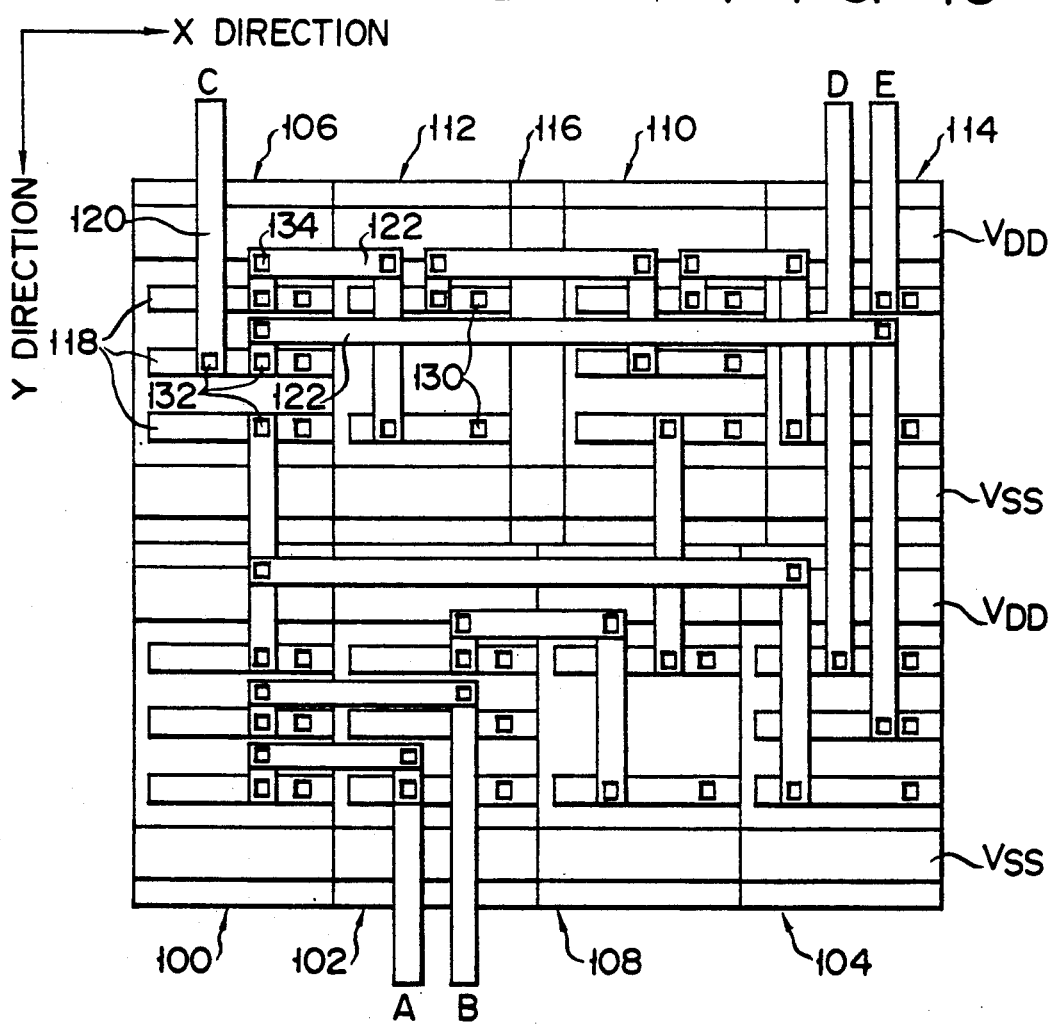
FIG. 14 is a plan view of a semiconductor device having a full adder circuit formed on a semiconductor substrate by using the standard cells shown in FIG. 13.

FIG. 13 is a plan view showing a fourth example of a basic registered pattern of the standard cell of this invention in the library, and FIG. 14 is a plan view of a semiconductor device having the full adder circuit of FIG. 1 using the standard cells shown in FIG. 13.

In FIGS. 13 and 14, the same portions as those in FIGS. 3A and 6 are denoted by the same reference numerals, and only different portions are explained.

In the standard cell of FIG. 13, the cell terminal wirings 118 are in the X direction or in the same direction as the power source lines VDD and VSS.

In the device according to this embodiment, since the inter-cell wirings are implemented by the third and fourth aluminum layers, it is possible to arrange the cell terminal wirings 118 in the X direction or the same direction as the power source lines VDD and VSS.

With the semiconductor device using the above standard cell, the device may have such a plane pattern as shown in FIG. 14.

With the registered pattern of the standard cell as in this example, an intra-cell pattern implemented by the first aluminum layer as shown in FIG. 15 can be obtained, for example.

FIG. 15 is a plan view of the standard cell in which a schematic plane pattern of the intra-cell wirings is partly shown. In FIG. 15, the same portions as those in FIGS. 3A and 8 are denoted by the same reference numerals.

That is, as shown in FIG. 15, since the cell terminal wirings 118 implemented by the second aluminum layer are arranged in the X direction, the arrangement interval between the intra-cell wirings 206 formed of the first aluminum layer to extend in the Y direction can be made small.

In FIG. 15, Y1 to Y5 denote the wiring areas.

EMBODIMENT 5

FIG. 16 is a plan view showing a fifth example of a basic registered pattern of the standard cell of this invention in the library.

In FIG. 16 the same portions as those in FIGS. 3A and 6 are denoted by the same reference numerals, and only different portions are explained.

In the standard cell of FIG. 16, some of the cell terminal wirings 118 are within the occupied area 50 of the standard cell and the remaining cell terminal wirings project to the exterior from the occupied area 50 of the standard cell.

In this way, the length of the cell terminal wirings 118 can be variously changed and registered into the library.

EMBODIMENT 6

Figure 17:
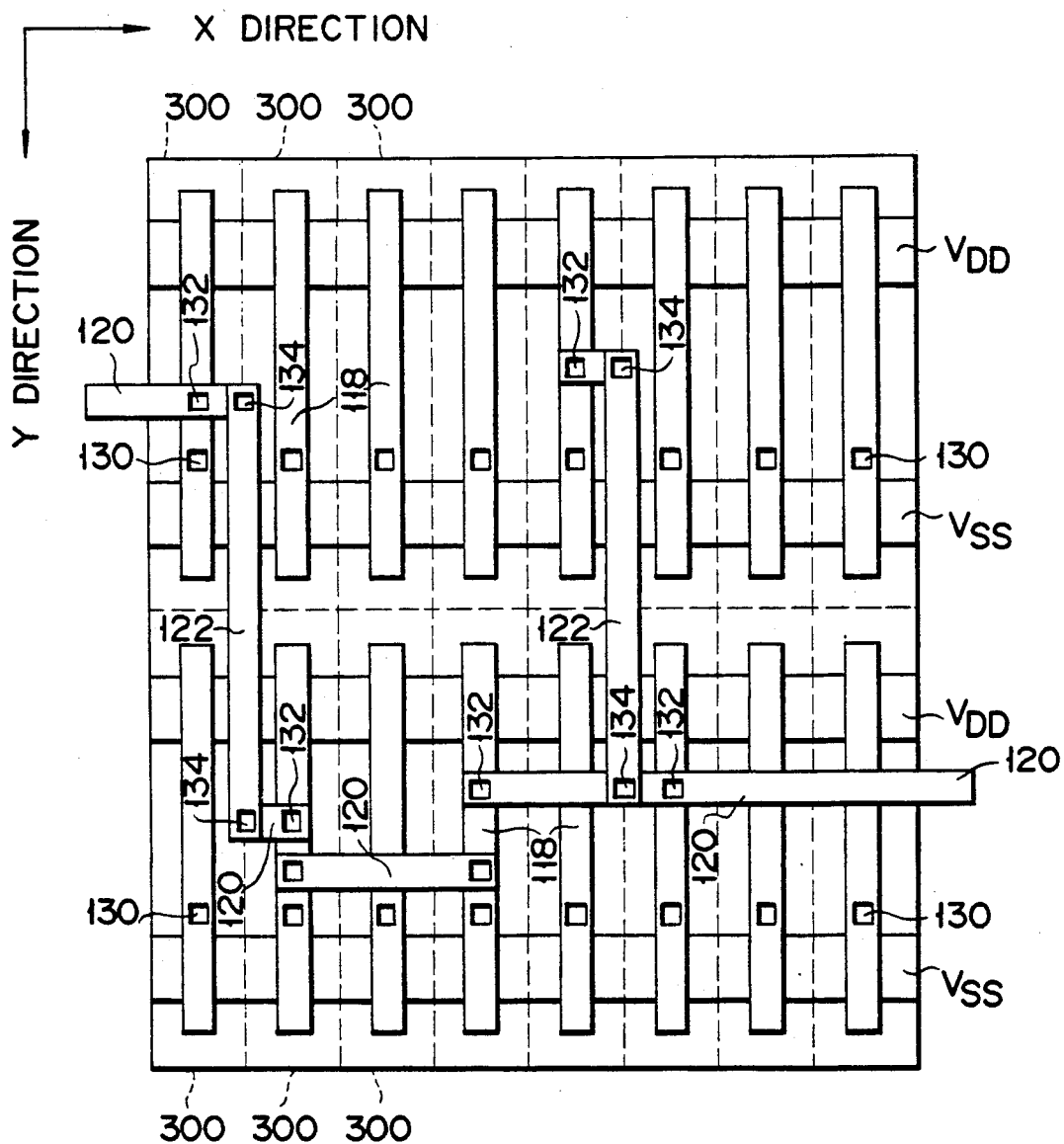
FIG. 17 is a plan view showing a sixth example of a semiconductor device formed on a semiconductor substrate by using the gate array system.

FIG. 17 is a plan view illustrating a semiconductor device according to a sixth embodiment of the invention. This device is of the gate-array structure, not the standard-cell structure applied to the first to fifth embodiments described above. Those of the elements of the device, which are identical to those shown in FIG. 6, are designated by the same numerals in FIG. 17, and will not be described in detail.

As is shown in FIG. 17, base cells 300 are arranged on a semiconductor substrate, in rows and column, or in a matrix pattern. This embodiment has four aluminum layers. The first aluminum layer is pattern, thus implementing intra-cell wirings, and the second aluminum layer is patterned, thus forming cell terminal wirings 118. The third and fourth aluminum layers are patterned, forming inter-cell wirings 120 and 122, which connects the base cells 300 to one another. Hence, no channel regions need be provided amount the base cells 300.

In the first to sixth embodiments, the intra-cell wirings are implemented by one aluminum layer, i.e., the first aluminum layer. If necessary, they can be implemented by two or more aluminum layers. In the case where they are made of two aluminum layers, the cell terminal wirings are implemented by the third aluminum layer, and the inter-cell wirings are implemented by the fourth aluminum layer and the upper aluminum layer or layers.

Additional advantages and modifications will readily occur to those skilled in the art. Therefore, the invention in its broader aspects is not limited to the specific details, and representative devices, shown and described herein. Accordingly, various modifications may be without departing from the spirit or scope of the general inventive concept as defined by the appended claims and their equivalents.

What is claimed is:

1. A semiconductor device comprising:
   a plurality of standard cells;
   a first array, arranged in a first direction, having some of the plurality of standard cells on a common level;
   a second array, arranged in the first direction adjacent to the first array, having others of the plurality of standard cells on the common level;
   first and second power lines implemented by a first conductive layer on a second level above the standard cells and extending in the first direction, for operating the standard cells;
   a first wiring implemented by a second conductive layer on a third level above the first conductive layer, extending in a second direction perpendicular to the first direction, the first wiring including a plurality of wires having a common length, each wire corresponding to an input/output terminal of a standard cell;
   a second wiring, entirely disposed over the first array, implemented by a third conductive layer above the second conductive layer, extending in the first direction, and connected to the first wiring;
   a third wiring, entirely disposed over the second array, implemented by the third conductive layer, extending in the first direction, and connected to the first wiring; and a fourth wiring implemented by a fourth conductive layer above the third conductive layer, extending in the second direction, and connected to the first wiring at connection portions entirely disposed over the first and second arrays.

2. A semiconductor device according to claim 1, further including a fifth wiring, connected between the first and second wirings, implemented by the third conductive layer and extending in the first direction.

3. A semiconductor device according to claim 2, wherein each wire includes a first contact portion connected to the input/output terminal, and a second contact portion connected to the second wirings, the first and second contact portions being arranged at different positions in the first wiring.

4. A semiconductor device according to claim 3, wherein the second array is contiguous to the first array.

5. A semiconductor device according to claim 4, wherein the first contact portion linearly extends in the first direction.

6. A semiconductor device according to claim 2, wherein the first and second power lines are arranged apart from end portions of the standard cells in the second direction.

7. A semiconductor device according to claim 6, wherein each standard cell includes a logic circuit.

8. A semiconductive device according to claim 1, wherein the plurality of wires are arranged over the first and second arrays.

* * * * *